United States Patent
Tan et al.

(10) Patent No.: US 9,837,380 B2
(45) Date of Patent: Dec. 5, 2017

(54) SEMICONDUCTOR DEVICE HAVING MULTIPLE CONTACT CLIPS

(71) Applicant: Infineon Technologies Austria AG, Villach (AT)

(72) Inventors: Tian San Tan, Melaka (MY); Theng Chao Long, Melaka (MY)

(73) Assignee: Infineon Technologies Austria AG, Villach (AT)

( * ) Notice: Subject to any disclaimer, the term of this patent is extended or adjusted under 35 U.S.C. 154(b) by 321 days.

(21) Appl. No.: 14/165,720

(22) Filed: Jan. 28, 2014

(65) Prior Publication Data

US 2015/0214189 A1 Jul. 30, 2015

(51) Int. Cl.
*H01L 23/00* (2006.01)
*H01L 25/065* (2006.01)
(Continued)

(52) U.S. Cl.
CPC .......... *H01L 25/0655* (2013.01); *H01L 21/56* (2013.01); *H01L 23/3107* (2013.01); *H01L 23/3121* (2013.01); *H01L 23/4334* (2013.01); *H01L 23/49513* (2013.01); *H01L 23/49524* (2013.01); *H01L 23/49562* (2013.01); *H01L 23/49575* (2013.01); *H01L 24/37* (2013.01); *H01L 24/38* (2013.01); *H01L 24/70* (2013.01); *H01L 24/73* (2013.01); *H01L 24/83* (2013.01); *H01L 24/84* (2013.01); *H01L 24/89* (2013.01); *H01L 24/97* (2013.01); *H01L 25/072* (2013.01); *H01L 25/50* (2013.01); *H01R 4/00* (2013.01); *H01L 24/05* (2013.01); *H01L 24/29* (2013.01); *H01L 24/32* (2013.01); *H01L 24/33* (2013.01); *H01L 24/40* (2013.01); *H01L 24/48* (2013.01); *H01L 2224/04026* (2013.01);
(Continued)

(58) Field of Classification Search
CPC ... H01L 25/0655; H01L 25/072; H01L 24/40; H01L 24/41; H01L 24/69; H01L 24/70; H01L 24/83; H01L 24/84; H01L 24/89
See application file for complete search history.

(56) References Cited

U.S. PATENT DOCUMENTS

2008/0185719 A1* 8/2008 Cablao ................ H01L 25/0652
257/738
2008/0197463 A1* 8/2008 Otremba ........... H01L 23/49524
257/676
(Continued)

FOREIGN PATENT DOCUMENTS

CN 101567367 A 10/2009
CN 101699623 A 4/2010
(Continued)

*Primary Examiner* — Lex Malsawma
*Assistant Examiner* — J. R. Oakley
(74) *Attorney, Agent, or Firm* — Murphy, Bilak & Homiller, PLLC (57) ABSTRACT

A semiconductor device includes a device carrier, a first semiconductor chip mounted on the device carrier and a second semiconductor chip mounted on the device carrier. Further, the semiconductor device includes a first contact clip bonded to a first electrode of the first semiconductor chip, a second contact clip bonded to a first electrode of the second semiconductor chip and an insulating connector configured to hold the first contact clip and the second contact clip together.

20 Claims, 4 Drawing Sheets

(51) Int. Cl.
  H01L 21/56 (2006.01)
  H01L 23/31 (2006.01)
  H01L 25/00 (2006.01)
  H01R 4/00 (2006.01)
  H01L 25/07 (2006.01)
  H01L 23/433 (2006.01)
  H01L 23/495 (2006.01)

(52) U.S. Cl.
  CPC ........... *H01L 2224/05554* (2013.01); *H01L 2224/05609* (2013.01); *H01L 2224/05611* (2013.01); *H01L 2224/05639* (2013.01); *H01L 2224/05644* (2013.01); *H01L 2224/05647* (2013.01); *H01L 2224/05655* (2013.01); *H01L 2224/05664* (2013.01); *H01L 2224/05669* (2013.01); *H01L 2224/293* (2013.01); *H01L 2224/2929* (2013.01); *H01L 2224/29111* (2013.01); *H01L 2224/29139* (2013.01); *H01L 2224/29144* (2013.01); *H01L 2224/29147* (2013.01); *H01L 2224/29294* (2013.01); *H01L 2224/32227* (2013.01); *H01L 2224/32245* (2013.01); *H01L 2224/33181* (2013.01); *H01L 2224/37011* (2013.01); *H01L 2224/37013* (2013.01); *H01L 2224/3719* (2013.01); *H01L 2224/37026* (2013.01); *H01L 2224/40227* (2013.01); *H01L 2224/40245* (2013.01); *H01L 2224/40499* (2013.01); *H01L 2224/48227* (2013.01); *H01L 2224/48245* (2013.01); *H01L 2224/73221* (2013.01); *H01L 2224/73263* (2013.01); *H01L 2224/73265* (2013.01); *H01L 2224/8384* (2013.01); *H01L 2224/83143* (2013.01); *H01L 2224/83447* (2013.01); *H01L 2224/83801* (2013.01); *H01L 2224/83815* (2013.01); *H01L 2224/83825* (2013.01); *H01L 2224/83855* (2013.01); *H01L 2224/8484* (2013.01); *H01L 2224/84143* (2013.01); *H01L 2224/84447* (2013.01); *H01L 2224/84815* (2013.01); *H01L 2224/84825* (2013.01); *H01L 2224/84855* (2013.01); *H01L 2224/97* (2013.01); *H01L 2924/00014* (2013.01); *H01L 2924/13055* (2013.01); *H01L 2924/13091* (2013.01); *H01L 2924/1425* (2013.01); *H01L 2924/14252* (2013.01); *H01L 2924/14253* (2013.01); *H01L 2924/181* (2013.01)

(56) References Cited

U.S. PATENT DOCUMENTS

| | | | |
|---|---|---|---|
| 2011/0221008 A1* | 9/2011 | Lu | H01L 23/49524 257/391 |
| 2013/0256856 A1* | 10/2013 | Mahler | H01L 24/40 257/676 |
| 2015/0041984 A1* | 2/2015 | Otremba | H01L 23/49575 257/773 |

FOREIGN PATENT DOCUMENTS

| | | |
|---|---|---|
| CN | 201752002 U | 2/2011 |
| CN | 102237343 A | 11/2011 |

* cited by examiner

SEMICONDUCTOR DEVICE HAVING MULTIPLE CONTACT CLIPS

TECHNICAL FIELD

This invention relates generally to the technique of semiconductor device packaging, and in particular to the technique of embedding a semiconductor chip and components into an encapsulant.

BACKGROUND

Semiconductor device manufacturers are constantly striving to increase the performance of their products, while decreasing their cost of manufacture. A cost intensive area in the manufacture of semiconductor device packages is packaging the semiconductor chip. Thus, semiconductor device packages and methods of manufacturing the same at low expenses and high yield are desirable. In particular, the performance of power semiconductor device packages is dependent from the heat dissipation capability provided by the package. Packaging methods of power devices providing high thermal robustness at low expenses and improved reliability are desirable.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following detailed description, reference is made to the accompanying drawings, which form a part thereof, and in which is shown by way of illustration specific embodiments in which the invention may be practiced. In this regard, directional terminology, such as "top", "bottom", "front", "back", "upper", "lower", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the word "over" used with regard to a part, element or material layer formed or located "over" a surface may be used herein to mean that the part, element or material layer be located (e.g. placed, formed, deposited, etc.) "directly on", e.g. in direct contact with, the implied surface. The word "over" used with regard to a part, element or material layer formed or located "over" a surface may be used herein to mean that the part, element or material layer be located (e.g. placed, formed, deposited, etc.) "indirectly on" the implied surface with one or more additional parts, elements or layers being arranged between the implied surface and the part, element or material layer.

Devices containing two or more semiconductor chips are, inter alia, described herein. In particular, one or more power semiconductor chips may be involved. Power semiconductor chip(s) may, e.g., have a vertical structure, that is to say that the semiconductor chip (s) maybe fabricated in such away that electric currents can flow in a direction perpendicular to the main surfaces of the semiconductor chip(s). A semiconductor chip having a vertical structure has electrodes on its two main surfaces, that is to say on its top side and bottom side.

The semiconductor chips may be manufactured from specific semiconductor material such as, for example, Si, SiC, SiGe, GaAs, GaN, etc., and, furthermore, may contain inorganic and/or organic materials that are not semiconductors. The semiconductor chips may be of different types and may be manufactured by different technologies.

The semiconductor devices described herein may include one or more logic integrated circuits to control the power semiconductor chip(s). The logic integrated circuit may include one or more driver circuits to drive one or more of the power semiconductor chips. The logic integrated circuit may, e.g., be a microcontroller including, e.g., memory circuits, level shifters, etc.

The semiconductor chips may have electrodes (chip pads) which allow electrical contact to be made with the integrated circuits included in the semiconductor chips. The electrodes may include one or more metal layers which are applied to the semiconductor material of the semiconductor chips. The metal layers may be manufactured with any desired geometric shape and any desired material composition. The metal layers may, for example, be in the form of a layer or land covering an area. By way of example, any desired metal capable of forming a solder bond or a diffusion solder bond, for example Cu, Ni, NiSn, Au, Ag, Pt, Pd, In, Sn, and an alloy of one or more of these metals may be used as the material. The metal layers need not be homogenous or manufactured from just one material, that is to say various compositions and concentrations of the materials contained in the metal layers are possible.

Vertical power semiconductor chips may, for example, be configured as power MOSFETs (Metal Oxide Semiconductor Field Effect Transistors), IGBTs (Insulated Gate Bipolar Transistors), JFETs (Junction Gate Field Effect Transistors), power bipolar transistors, or power diodes. Byway of example, the source contact electrode and the gate contact electrode of a power MOSFET may be situated on one main surface, while the drain contact electrode of the power MOSFET may be arranged on the other main surface. In case of a power diode, the anode contact electrode may be situated on one main surface, while the cathode contact electrode of the power diode may be arranged on the other main surface.

One or more semiconductor power chips are mounted over a device carrier. In one embodiment, the device carrier may comprise multiple metal plates such as, e.g., die pads and/or terminal pads of, e.g., a leadframe. The metal plates may serve as chip carriers, e.g. chip pads. The metal plates may be made of any metal or metal alloy, e.g. copper or copper alloy. Byway of example, such device carrier may be a so-called TSLP- (Thin Small Leadless Package-) carrier. In other embodiments, the device carrier may comprise a layer of plastics coated with a structured metal layer. By way of example, such chip carriers may be a single-layer PCB or a multi-layer PCB. The PCB may have at least one insulating layer and a structured metal foil layer attached to the insulating layer. The insulating layer may comprise or be made on the basis of epoxy resin, polytetrafluoroethylene, aramid fibers or carbon fibers and may include reinforcement means such as fiber mats, for example glass or carbon fibers. In other embodiments, the device carrier may comprise a plate of ceramics coated with a structured metal layer, e.g. a metal bonded ceramics substrate. By way of example, the device carrier may be a DCB (direct copper bonded) ceramics substrate.

A multi-clip connection element is provided in the semiconductor device package. The multi-clip connection element comprises a first contact clip bonded to a first electrode (e.g. load electrode) of a first semiconductor chip and second contact clip bonded to a first electrode (e.g. load electrode) of a second semiconductor chip. The multi-clip connection element further comprises an insulating connector configured to hold the first contact clip and the second contact clip together. That way, the multi-clip connection element is one easy-to-manage single piece.

The two or more semiconductor chips and, e.g., the multi-clip connection element may at least partly be surrounded or embedded in at least one electrically insulating material. The electrically insulating material forms an encapsulant. The encapsulating material may be an electrically insulating material and may comprise or be a thermoset material or a thermoplastic material. A thermoset material may, e.g., be made on the basis of an epoxy resin, a silicone resin or an acrylic resin. A thermoplastic material may, e.g., comprise one or more materials selected from the group of polyetherimide (PEI), polyether-sulfone (PES), polyphenylene-sulfide (PPS), polyamide-imide (PAI), and polyethylene-terephthalate (PET). Thermoplastic materials melt by application of pressure and heat during molding or lamination and (reversibly) harden upon cooling and pressure release.

The encapsulating material may comprise or be a polymer material, e.g. a duroplastic polymer material. The encapsulating material may comprise or be at least one of a filled or unfilled mold material, a filled or unfilled thermoplastic material, a filled or unfilled thermoset material, a filled or unfilled laminate, a fiber-reinforced laminate, a fiber-reinforced polymer laminate, and a fiber-reinforced polymer laminate with filler particles.

The encapsulating material may be applied over the two or more semiconductor chips and, e.g., the multi-clip connection element by, e.g., molding or laminating.

In the first case, i.e. if the encapsulating material is a mold material, various techniques such as, e.g., compression molding, injection molding, powder molding, or liquid molding may be used to form an encapsulant or an encapsulation body containing a plurality of encapsulants. The mold material may be applied to overmold the semiconductor chips and the device carrier on which the semiconductor chips may be mounted.

In the second case, i.e. if the encapsulating material is made of a laminate material, the encapsulating material may have the shape of a piece of a layer, e.g. a piece of a sheet or foil that is laminated over the semiconductor chips and over the device carrier on which the semiconductor chips are mounted. Heat and pressure may be applied for a time suitable to attach the piece of a foil or sheet to the underlying structure. During lamination, the electrically insulating foil or sheet is capable of flowing (i.e. is in a plastic state), resulting in that gaps between the semiconductor chips and/or other topological structures such as, e.g., the multi-clip connection element are filled with the polymer material of the electrically insulating foil or sheet. The electrically insulating foil or sheet may comprise or be any appropriate thermoplastic or thermoset material. In various embodiments, the insulating foil or sheet may comprise or be a prepreg (short for pre-impregnated fibers), that is e.g. made of a combination of a fiber mat, for example glass or carbon fibers, and a resin, for example a thermoset or thermoplastic material. Prepreg materials are typically used to manufacture PCBs (printed circuit boards).

A variety of different types of electronic devices may be designed to use a contact clip as described herein or may be manufactured by the techniques described herein. By way of example, an electronic device in accordance with the disclosure may constitute a power supply containing two or more power semiconductor chips, e.g. MOSFETs, and one or more logic integrated circuits. For instance, an electronic device disclosed herein may comprise a half-bridge circuit including a high side transistor, a low side transistor and a logic integrated circuit chip. The logic integrated circuit chip may, optionally, include one or a plurality of transistor driver circuitry.

A half-bridge circuit as disclosed herein may, e.g., be implemented in an electronic circuit for converting DC or AC voltages into DC voltages, so-called DC-DC converters and AC-DC converters, respectively. DC-DC converters may be used to convert a DC input voltage provided by a battery or rechargeable battery into a DC output voltage matched to the demands of electronic circuits connected downstream. By way of example, a DC-DC converter described herein may be a buck converter or down-converter. AC-DC converters may be used to convert an AC input voltage provided by, e.g., a high voltage AC power network into a DC output voltage matched to the demands of electronic circuits connected downstream.

Figure 1:
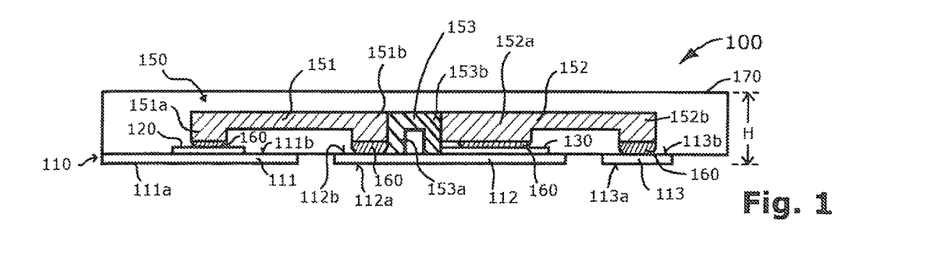
FIG. 1 schematically illustrates a cross-sectional view of an exemplary semiconductor device package including two semiconductor chips and two clips held together by a connector.

FIG. 1 illustrates a cross-sectional view of an exemplary semiconductor device package 100. The semiconductor device package 100 may comprise a device carrier 110, a first semiconductor chip 120 mounted on the device carrier 110 and a second semiconductor chip 130 mounted on the device carrier 110. Further, the semiconductor device package 100 comprises a multi-clip connection element 150. The multi-clip connection element 150 may comprise a first contact clip 151, a second contact clip 152 and an insulating connector 153 holding together the first and second contact clips 151, 152.

The device carrier 110 may, e.g., comprise multiple carrier pads, e.g. a first carrier pad 111 on which the first semiconductor chip 120 is mounted, a second carrier pad 112 on which the second semiconductor chip 130 may be mounted, and a third carrier pad 113 on which, e.g., no semiconductor chip is mounted. The first, second and third carrier pads 111, 112, 113 may each serve, e.g., as external terminals of the semiconductor device package 100. That is, the first, second, and third carrier pads 111, 112, 113 may, e.g., be configured to be connected to an external application such as, e.g., an application board (not shown). By way of example, bottom surfaces 111a, 112a, and 113a of the first, second, and third carrier pads 111, 112, 113, respectively, may be coplanar and may, e.g., define a mounting surface of the semiconductor device package 110. It is to be noted that a carrier pad 111, 112, 113 may serve, e.g., as solely a chip pad, as a chip pad and an external terminal or as solely an external terminal of the package 100.

The first semiconductor chip 120 may be mounted on a top surface 111b of the first carrier pad 111. The second semiconductor chip 130 may be mounted on a top surface 112b of the second carrier pad 112.

By way of example, without loss of generality, the first and/or the second semiconductor chips 120, 130 may be power semiconductor chips (in general, it is also possible that one of the semiconductor chips is a power semiconductor chip and the other one is a non-power semiconductor chip such as, e.g., a gate driver chip). A power semiconductor chip may, e.g., be configured as a power transistor, for example, a power MOSFET, IGBT, JFET or power bipolar transistor, or a power diode. In the case of a power MOSFET or a JFET, a first load electrode is a source electrode, a second load electrode is a drain electrode, and a third electrode is a gate electrode. In the case of an IGBT, a first electrode is an emitter electrode, a second electrode is a collector electrode, and a third electrode is a gate electrode. In the case of a power bipolar transistor, a first electrode is an emitter electrode, the second electrode is a collector electrode, and third electrode is a base electrode. In the case of a power diode, first and second electrodes are cathode and anode, respectively, and there is no third electrode. During operation, voltages higher than 5, 50, 100, 500 or 1000 V may be applied between the first and second electrodes. The switching frequency applied to the third electrode may be in the range from 1 kHz to 100 MHz, but may also be outside of this range.

The first contact clip 151 may be bonded e.g. to the first load electrode of the first power semiconductor chip 120. More specifically, the first contact clip 151 may comprise a first bond portion 151a bonded to the first electrode of the first power semiconductor chip 120 and may comprise a second bond portion 151b which may be bonded to, e.g., the top surface 112b of the second carrier pad 112. The second contact clip 152 may comprise a first bond portion 152a, which may, e.g., be bonded to the first electrode of the second semiconductor chip 130, and may comprise a second bond portion 152b, which may. e.g., be bonded to the third carrier pad 113, e.g. to the upper surface 113b thereof. The bond portions 151a, 151b and 152a, 152b of the respective contact clips 151 and 152, respectively, may form protrusions at the lower surface of the contact clips 151 and 152, respectively.

The insulating connector 153 may comprise a first coupling portion 153a connected to the first contact clip 151, e.g. more specifically to the second bond portion 151b of the first contact clip 151. The insulating connector 153 may further comprise a second coupling portion 153b connected to the second contact clip 152, more specifically, e.g., to the first bond portion 152a of the second contact clip 152.

Bond layers configured to create the above-mentioned bond connections are denoted by reference numeral 160. The bond layers 160 may, e.g., comprise or consist of solder, a soft solder, a diffusion solder, an electrically conducting paste, a nanopaste, a sinter metal material, or an electrically conducting adhesive.

By way of example, if the bond layers are, e.g., of a diffusion soldering material such as, e.g., AuSn, AgSn, CuSn, AgIn, AuIn, CuIn, AuSi, Sn, or Au, or of an electrically conducting paste containing metal particles distributed in a polymer material (so-called nanopaste), the bonding layers 160 may be generated by the application of heat in order to reflow, sinter or cure the bonding material.

The first and the second power semiconductor chips 120, 130, and/or the multi-clip connection element 150 may be at least partly embedded in an encapsulating material forming an encapsulant 170. The encapsulant 170 may, e.g., be a mold material or a laminate. The encapsulant 170 may completely cover the multi-clip connection element 150, i.e. the top surface of the semiconductor device package 100 may be completely formed by encapsulating material. In other examples, as will be described further below, surface sections of the first and/or second contact clips 151, 152 may be exposed by the encapsulant 170 to provide for high thermal transfer and heat removable capabilities of the package 100.

Figure 2:
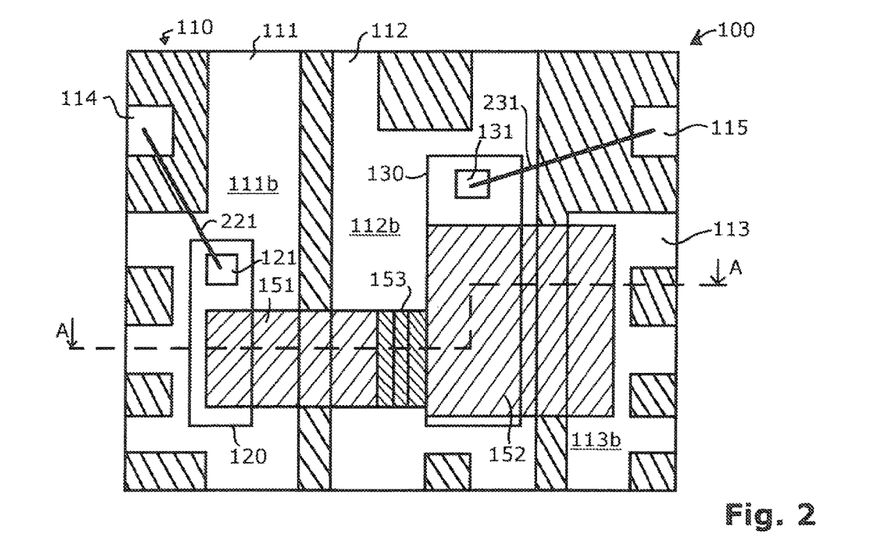
FIG. 2 schematically illustrates a top view of an exemplary semiconductor device package including two semiconductor chips and two clips held together by a connector.

Referring to FIG. 2, a top view of a semiconductor device package such as, e.g., package 100 is depicted. The encapsulant 170 is not shown in order to illustrate the package design.

The semiconductor device package 100 may have a rectangular shape or outline. As illustrated in FIG. 2, the first, second, and third carrier pads 111, 112, 113 maybe insular, i.e. may not be electrically interconnected within the device carrier 110. The device carrier 110 may comprise additional carrier pads, e.g. carrier pad 114 and carrier pad 115. Carrier pads 114 and 115 may e.g. be smaller in size than the first, second, and third carrier pads 111, 112, 113.

By way of example, a so-called half-bridge circuitry may be implemented. The first power semiconductor chip 120 may form the low side power switch and the second power semiconductor chip 130 may form the high side power switch of the half-bridge. Byway of example, the drain electrode of the first power semiconductor chip 120 may be connected via the bond layer 160 to the first carrier pad 111. The source electrode of the first power semiconductor chip 120 may be connected to the first bond portion 151a of the first contact clip 151. Further, the drain electrode of the second power semiconductor chip 130 may be connected via the bond layer 160 to the second carrier pad 112. The source electrode of the second power semiconductor chip 130 may be connected to the first bond portion 152a of the second contact clip 152. The first contact clip 151 and the second contact clip 152 are not electrically connected to one another. The insulating connector 153, which mechanically fixes the first and second contact clips 151, 152 together, does not provide for an electrical connection between the first and second contact clips 151, 152.

The third (e.g. gate) electrode 121 of the first power semiconductor chip 120 may be connected by an electrical interconnect, e.g. by a bond wire 221, to the third carrier pad 114. The third (e.g. gate) electrode 131 of the second power semiconductor chip 130 may be connected by an electrical interconnect, e.g. by a bond wire 231, to the fifth carrier pad 115.

It is to be noted that a variety of modifications are possible. By way of example, one or both semiconductor chips 120, 130 may be mounted in a flip-chip orientation (not shown). Further, the device package 110 may include one or more further semiconductor chips (not shown) such as, e.g., a logic integrated circuit configured to control one or both of the first power semiconductor chip 120 and the second power semiconductor chip 130. In this case, the third electrode 121 and/or the third electrode 131 of the first and/or second power semiconductor chips 120, 130 may be internally connected to such logic integrated circuit rather than to pads 114, 115 of the device carrier 110. It is also possible that only one of the semiconductors chips 120, 130 is a power semiconductor chip and the other is a logic integrated circuit controlling the gate electrode of the power semiconductor chip.

Figure 3:
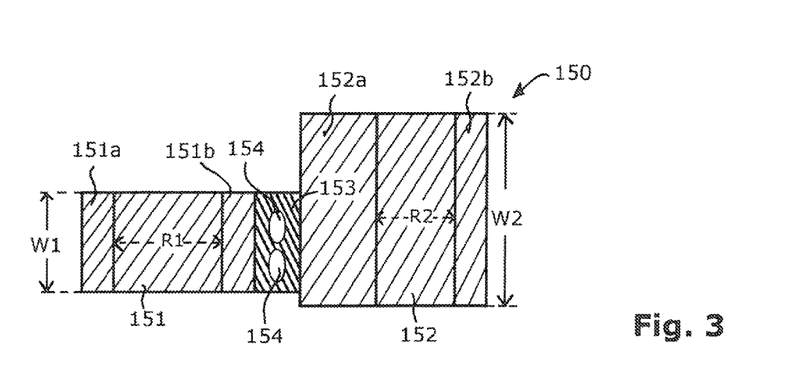
FIG. 3 schematically illustrates a top view of an exemplary multi-clip connection element including two clips held together by a connector.
Figure 4:
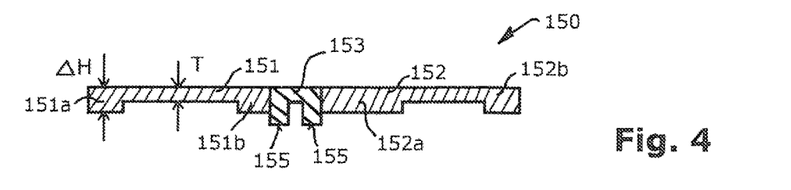
FIG. 4 schematically illustrates a cross-sectional view of an exemplary multi-clip connection element including two clips held together by a connector.

FIGS. 3 and 4 illustrate, byway of example, an exemplary implementation of the multi-clip connection element 150. As illustrated in FIG. 3, the two contact clips 151, 152 may have different dimensions or shapes. By way of example, the width W1 of the first contact clip 151 may be smaller than the width W2 of the second contact clip 152. Further, the electrical resistance R1 of the first contact clip 151 may be greater than the electrical resistance R2 of the second contact clip 152. By way of example, the electrical resistance R1 of the first contact clip 151 may be equal to or greater or less than 0.35 mΩ and the electrical resistance R2 of the second contact clip 152 may be equal to or greater or less than 0.2 mΩ. The electrical resistances R1 and R2 are measured between the bond portions 151a, 151b and 152a, 152b of the respective contact clips 151 and 152, respectively.

The insulating connector 153 may be made of a dielectric material, e.g. a plastic or polymer material. Side faces of the insulating connector 153 may serve as coupling portions to the first and second contact clips 151 and 152, respectively. By way of example, the side faces of the insulating connector 153 may be glued to corresponding side faces of the first and second contact clips 151, 152 or maybe fixedly secured by other means to the first and second contact clips 151, 152. Any mechanical connections such as, e.g., a plug and socket connection, a tongue and groove connection, a clamp connection, a snap fit (or clip-lock) connection or the like are also possible. The insulating connector 153 may be configured to rigidly connect the first and second contact clips 151, 152 together. Thus, the multi-clip connection element 150, albeit assembled of multiple parts, may be manipulated as one piece.

The insulating connector 153 may have one or more holes 154 penetrating the insulating connector 153 in a vertical direction. The holes 154 may be provided to increase the engagement between the insulating connector 153 and the encapsulant 170. Further, the holes 154 may prevent the generation of air voids captured under the insulating connector 153.

The insulating connector 153 may be supported by the device carrier 110. By way of example, bottom faces 155 of the insulating connector 153 may be placed on the device carrier 110, e.g. on the second carrier pad 112 thereof. That way, the insulating connector 153 may be used to control the location of the multi-clip connection element 150 in the semiconductor device package 100. In particular, the location of the multi-clip connection element 150 in the vertical direction (height) may be controlled by the height of the insulating connector 153.

It is also possible that the location of the multi-clip connection element 150 in the semiconductor device package 100 is controlled by the insulating connector 153 in the lateral direction. Control of the location in the lateral direction may, e.g., be provided by a topographic structure (e.g. recesses, protrusions or the like) at the upper surface 112b of the device carrier 110. The topographic structure (not shown) may be configured to fit the insulating connector 153 in place on the device carrier 110 in the lateral direction. That is, in general the insulating connector 153 may be used to provide for self-alignment of the multi-clip connection element 150 in the vertical and/or lateral dimension during the placement and/or the bonding of the multi-clip connection element 150 on the device carrier 110.

It is to be noted that both the mechanical interconnect between the two (or multiple) contact clips 151, 152 and the control of the location of the multi-clip connection element 150 over the device carrier 110 may significantly facilitate the manufacturing process. While the first feature (mechanical interconnect) allows to reduce the pick-and-place processes needed for assembling the semiconductor device package 100, the location control feature, apart from facilitating the placing process, may allow for a precise control of the thickness of the bond layers 160. In this respect, it is to be noted that the thickness of the bond layers 160 over the first and second power semiconductor chips 120, 130 may, e.g., be desired to be different from the thickness of the bond layers 160 over the second and third carrier pads 112, 113, respectively. The control of bond layer thickness allows to improve the electrical/thermal performance of the semiconductor device package 100, reduces manufacturing tolerances and may allow to reduce the overall height of the semiconductor device package 100.

The semiconductor device package 100 may, e.g., have a height H in the range from about 0.5 mm to 2.0 mm. In particular, the height H may be equal to or less than 1.0 mm, 0.9 mm, 0.8 mm, 0.7 mm, and 0.6 mm.

The thickness (height) T of the contact clips 151, 152 between the their bonding portions 151a, 151b and/or 152a, 152b may, e.g., be greater than 100 μm, 200 μm, 300 μm, and 400 μm and/or may, e.g., be less than 500 μm, 400 μm, 300 μm, and 200 μm. The difference in height ΔH overcome by the contact clips 151, 152 at their bonding portions 151a, 151b and/or 152a, 152b may, e.g., range from about 150 μm to 1000 μm and may, e.g., be greater than or less than 300 μm, 400 μm, 500 μm, 600 μm, or 700 μm. The difference in height ΔH overcome by the contact clips 151, 152 may, e.g., be equal to or greater than 50%, 60%, 70%, or 80% of the total height H of the semiconductor device package 100.

The first and second semiconductor chips 120, 130 may have a thickness (height) in the range from about, e.g., 20 μm, 50 μm, 100 μm to about 200 μm, 300 μm, 500 μm. The device carrier 110 (e.g. a leadframe) may have a thickness (height) in the range from about, e.g., 100 μm to 500 μm, and may, e.g., be greater than or less than 200 μm, 300 μm, 400 μm. The first and second semiconductor chips 120, 130 may have a chip area of about 1 to 10 mm times 1 to 10 mm. It is to be noted that the sectional view of FIG. 1 may e.g. be obtained along sectional line A-A of FIG. 2.

Figure 5:
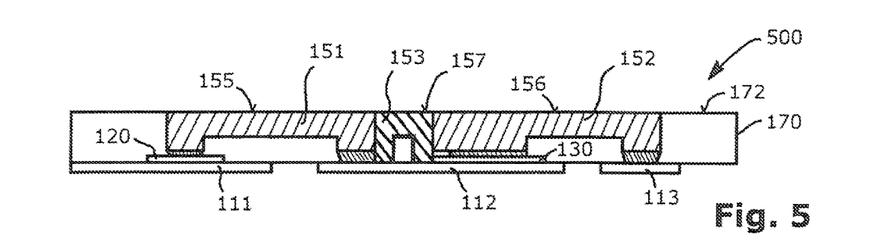
FIG. 5 schematically illustrates a cross-sectional view of an exemplary heat-sink design semiconductor device package including two semiconductor chips and two clips held together by a connector.

Referring to FIG. 5, a semiconductor device package 500 having a heat-sink design may be provided. Semiconductor device package 500 may be identical or similar to semiconductor device package 100 except that a top surface portion 155 of the first contact clip 151 maybe exposed at the periphery of the encapsulant 170 and/or a top surface portion 156 of the second contact clip 152 may be exposed at the periphery of the encapsulant 170. Byway of example, the exposed top surface portions 155, 156 may be coplanar. Further, the exposed top surface portions 155, 156 may level with the top surface 172 of the encapsulant 170. Further, a top surface portion 157 of the insulating connector 153 may level with the exposed top surface portions 155, 156 of the first and second contact clips 151, 152. The top surface portion 157 of the insulating connector 153 may thus be exposed at the periphery of the semiconductor device package 500. Apart from this, all features including dimensions, materials and other quantities and characteristics recited above for the semiconductor device package 100 may apply to the semiconductor device package 500, and reference is made to the description above in order to avoid reiteration.

Figure 6:
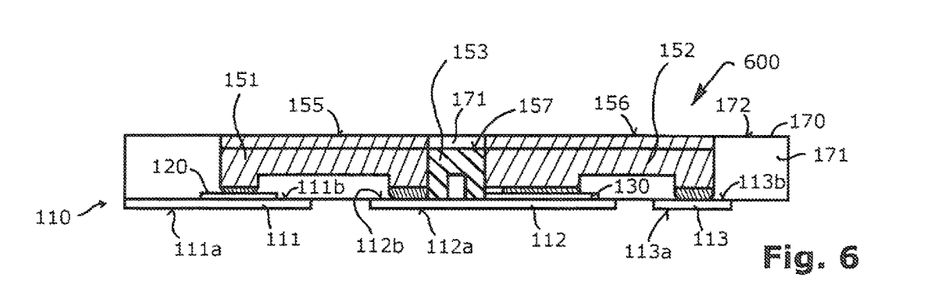
FIG. 6 schematically illustrates a cross-sectional view of an exemplary heat-sink design semiconductor device package including two semiconductor chips and two clips held together by a connector.

FIG. 6 illustrates a semiconductor device package 600. Similar to semiconductor device package 500, semiconductor device package 600 has a heat-sink design. In semiconductor device package 600 the top surface portions 155, 156 of the first and second contact clips 151, 152 are elevated in relation to the top surface portion 157 of the insulating connector 153. That way, the insulating connector 153 may be covered by encapsulating material 171, while one or more of the top surface portions 155, 156 may be exposed at the periphery of the encapsulant 170. In particular, if at least the top surface portion 156 of the second clip 152 is exposed, this results in a beneficial dual cooling facility of the first (e.g. source) electrode of the second semiconductor chip 130 (which may, e.g., dissipate more heat than the first semiconductor chip 120). Apart from this, reference is made to the description of the semiconductor device packages 100, 500 in order to avoid reiteration.

Figure 7:
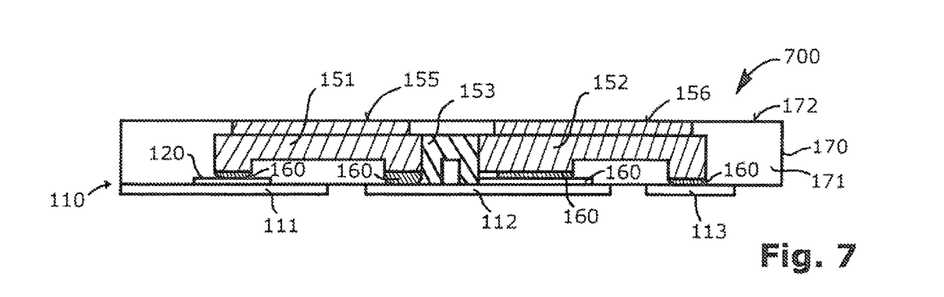
FIG. 7 schematically illustrates a cross-sectional view of an exemplary heat-sink design semiconductor device package including two semiconductor chips and two clips held together by a connector.
Figure 8A:
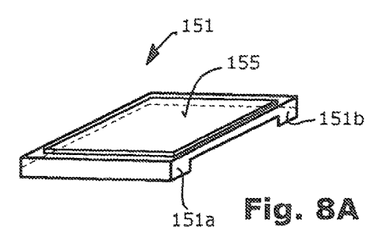
FIGS. 8A and 8B schematically illustrate perspective views of a section of an exemplary heat-sink design multi-clip connection element and a section of an encapsulant of an exemplary heat-sink design semiconductor device package, respectively.

FIG. 7 illustrates a semiconductor device package 700, which is similar to semiconductor device package 600 except that the top surface of the first semiconductor clip 151 and/or the top surface of the second semiconductor clip 152 may have a stepped structure. More specifically, as shown in FIG. 8A exemplarily for the first contact clip 151, the top surface of the first contact clip 151 may be recessed along an edge region of the first contact clip 151 to define the exposed top surface portion 155. That way, the area of the top surface portion 155 exposed at the periphery of the semiconductor package 700 is smaller than the area of the top surface of the first contact clip 151. The stepped edge region of the top surface of the first contact clip 151 causes the interface between the contact clip 151 and the encapsulant 170 to have a non-linear, stepped shape. This design may protect against heat-sink delamination (i.e. delamination between the first and/or second contact clip 151, 152 and the encapsulant 170) and further increases the forces by which the heat-sink (first and/or second contact clip 151, 152) is locked by the encapsulant 170 to the semiconductor device package 700. In other words, the reliability and the overall stability of the semiconductor package 700 may be improved by the stepped top surface of the first and/or second contact clip 151, 152.

Figure 8B:
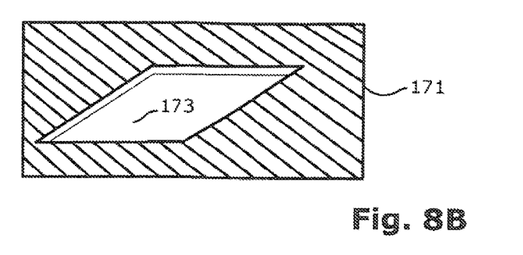

FIG. 8B illustrates a perspective view of an opening 173 provided in the top surface 172 of the encapsulant 170 in order to expose the top surface portion 155 of the first contact clip 151. As to the second contact clip 152 and the top surface portion 156 thereof, the same design may e.g. be applied and reference is made to the description above in order to avoid reiteration.

Figure 9A:
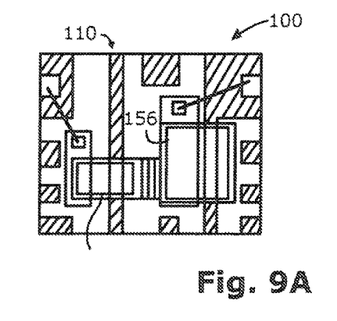
FIGS. 9A and 9B schematically illustrate top views of exemplary heat-sink design semiconductor device packages without and with applied encapsulant, respectively.
Figure 9B:
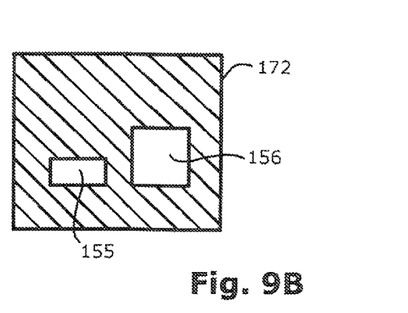

FIGS. 9A and 9B illustrate top views of the semiconductor device package without (FIG. 9A) and with (FIG. 9B) encapsulant 170. The top surface portions 155, 156 exposed at the top surface 172 of the encapsulant 170 may serve for dual heat-sink operation.

Figures 10A, 10B:
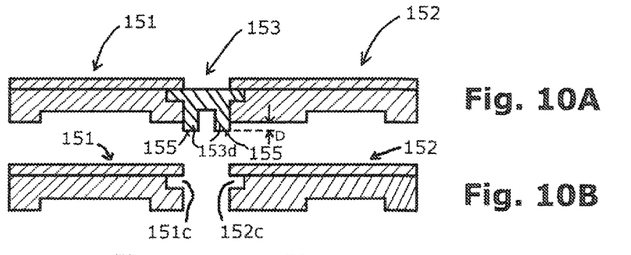
FIGS. 10A, 10B, and 10C schematically illustrate exemplary sectional views of an exemplary multi-clip connection element including two clips held together by a connector, the two clips and the connector, respectively.
Figure 10C:
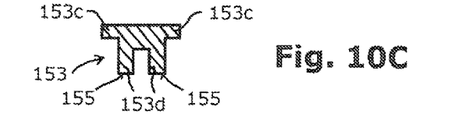

FIGS. 10A to 10C illustrate an exemplary clip-lock (or snap-fit) design of the insulating connector 153. By way of example, the insulating connector 153 may have tongues or engaging protrusions 153c at side faces thereof. The tongues or engaging protrusions 153c may be configured to fit into grooves or recesses 151c, 152c provided at, e.g., side surfaces of the first and second contact clips 151 and 152, respectively. That way, the first and second contact clips 151, 152 may be clip-locked, snap-fitted or otherwise mechanically locked in place to the insulating connector 153. The side faces of the insulating connector 153 and the side surfaces of the first and second contact clips 151 and 152 facing each other may abut to provide stability. Further, the insulating connector 153 may comprise a bottom support portion 153d. The bottom support portion 153d may optionally be configured to be supported by the device carrier 110. More specifically, the bottom support portion 153d may project with its bottom face 155 a predetermined distance D over the bottom surface of the second and/or the first bond portions 151b, 152a of the first and the second contact clip 151, 152, respectively, to interact with the device carrier 110 (D may be identical or different for the first and second contact clips 151, 152). By setting the projecting distance D to an appropriate value, a precise control of the height of the multi-clip connection element over the device carrier 110 may be achieved. It is also possible that a projecting support structure may e.g. be formed on the device carrier 110 rather than at the insulating connector 153.

Generally, the insulating connector 153 may be a pre-fabricated part. It may, e.g., a pre-molded part such as, e.g., a pre-molded plastic part. The material of the insulating connector 153 may be different from the encapsulating material 171. The insulating connector 153 may, e.g., be shaped so as to only fill a gap between the contact clips 151, 152 and/or not to laterally reach over, around or under the contact clips 151, 152.

Figure 11:
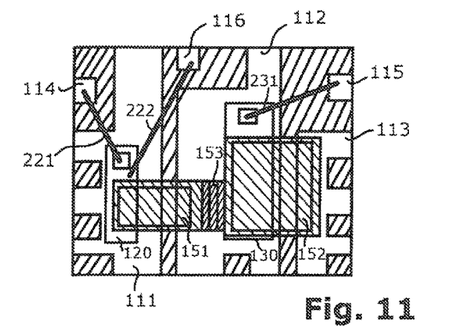
FIG. 11 schematically illustrates a top view of an exemplary semiconductor device package including two semiconductor chips and two clips held together by a connector.

Referring to FIG. 11, a great variety of different designs of device carriers 110 are possible. By way of example, the design shown in FIG. 11 distinguishes from the design shown in FIGS. 2 and 9A in that a further carrier pad 116 is provided. The carrier pad 116 may provide for an additional external terminal of the semiconductor device package. The carrier pad 116 may be coupled by an internal electrical interconnect, e.g. a bond wire 222 to a load electrode, e.g. the first (e.g. source) electrode of the first (power) semiconductor chip 120. That way, it is possible to probe the source voltage of the first (power) semiconductor chip 120 which may correspond to the drain voltage of the second (power) semiconductor chip 130.

Figure 12:
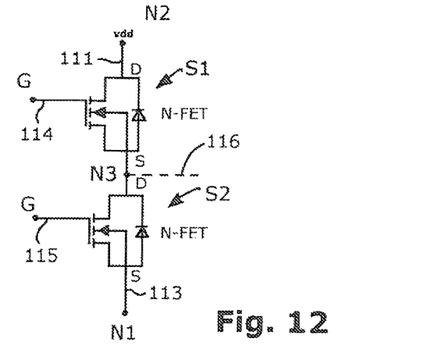
FIG. 12 illustrates a basic circuit diagram of an exemplary half-bridge semiconductor device package.

As already mentioned, the semiconductor devices described herein may, for example, be used as half-bridges. An exemplary circuit of a half-bridge arranged between nodes N1 (e.g. ground) and N2 (e.g. supply voltage Vdd) is shown in FIG. 12. The first power semiconductor chip 120 may implemented a high side switch S1 and the second power semiconductor chip 130 may implemented a low side switch S2. Then, the node N1 maybe the source of the second power semiconductor chip 130 and the node N2 may be the drain of the first power semiconductor chip 120. Node N3 may optionally be used for voltage sensing at carrier pad 116. By way of example, the high side switch S1 and/or the low side switch S2 may be implemented by N-MOSFETs.

Voltages applied between node N1 and node N2 may be equal to or greater than 30 V, 50 V, 300 V, 500 V, or 1000 V. In particular, voltages applied between nodes N1 and N2 may be in a range between, e.g., 30 to 50 V if the power semiconductor device is a DC-DC converter. Further, if the power semiconductor device is an AC-DC converter, the voltages applied between node N1 and node N2 may, e.g., be in a range between 300 to 1000 V.

It is to be noted that the concept of connecting/assembling two contact clips by one insulating connector to obtain a one piece multi-clip connection element may be extended to a plurality of contact clips and one or a plurality of insulating connectors. By way of example, it is possible that one insulating connector may be configured to hold three or more contact clips together. Further, it is possible that a plurality of two or more insulating connectors are used to hold pairs or groups of contact clips together. Thus, the concept disclosed herein may be advantageously applied to semiconductor device packages which include more components (e.g. more semiconductor chips, additional passives, etc.) than the semiconductor device packages exemplified above.

Figure 13A:
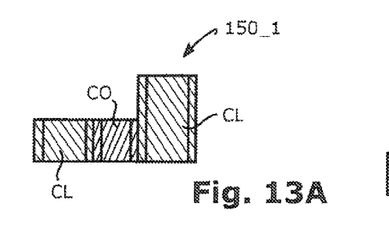
FIGS. 13A, 13B, and 13C schematically illustrate top views of exemplary multi-clip connection elements including two clips and one connector, three clips and two connectors, and four clips and three connectors, respectively, wherein the clips are held together by a connector(s).
Figure 13B:
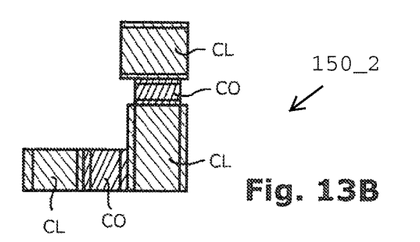
Figure 13C:
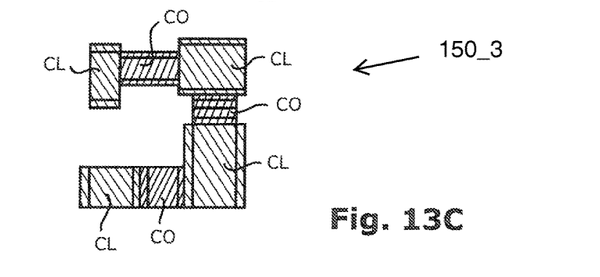

By way of example, FIGS. 13A to 13C illustrate various exemplary implementations of multi-clip connection elements 150_1, 150_2, and 150_3. Multi-clip connection elements 150_1 includes two contact clips CL and one insulating connector CO arranged between the two contact clips, i.e. is similar to multi-clip connection element 150. Multi-clip connection elements 150_2 includes, e.g., three contact clips CL and two insulating connectors CO, wherein each insulating connector CO is arranged between two of the three contact clips CL. Multi-clip connection elements 150_3 includes, e.g., four contact clips CL and three insulating connectors CO, wherein each insulating connector CO is arranged between two of the four contact clips CL. Dimensions and electrical characteristics among the contact clips CL and insulating connectors CO may be different. The contact clips CL may be bonded to load electrodes of the semiconductor chips. However, it is also possible that, e.g., the multi-clip connection element comprises a first contact clip CL which is bonded to a load electrode (e.g. thirst or second electrode) of a semiconductor power chip and may comprise a second contact clip which is bonded to a control electrode (e.g. third electrode) of this semiconductor power chip. In this case, byway of example, a second semiconductor chip may be a driver chip configured to drive the control electrode of the semiconductor power chip.

Figure 14:
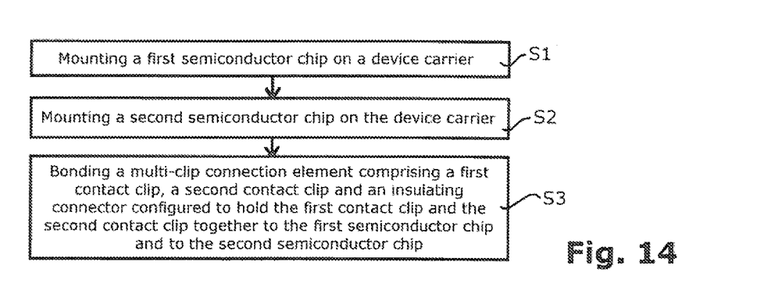
FIG. 14 is a flowchart of an exemplary process of manufacturing a semiconductor device package including two semiconductor chips and two clips held together by a connector.

FIG. 14 illustrates a flowchart of an exemplary process to manufacture a semiconductor device package as described herein. The process may be applied to all package types disclosed herein.

At S1, a first semiconductor chip (e.g. semiconductor chip 120 or 130) is mounted on a device carrier (e.g. device carrier 110).

At S2, a second semiconductor chip (e.g. semiconductor chip 130 or 120) is mounted on the device carrier. S1 and S2 may be performed sequentially or in parallel.

At S3, a multi-clip connection element comprising a first contact clip, a second contact clip and an insulating connector configured to hold the first contact clip and the second contact clip together is bonded to the first semiconductor chip and to the second semiconductor chip. Bonding may, e.g., be performed by a solder reflow process. Prior to the bonding process, the insulating connector may be pre-fabricated and the multi-clip connection element may be assembled.

During bonding the multi-clip connection element to the first semiconductor chip and to the second semiconductor chip, the multi-clip connection element may move into a predetermined rest position controlled by a support of the multi-clip connection element on the device carrier, e.g. by a mechanical interaction between the insulating connector and the device carrier. As described above, vertical self-alignment and/or lateral self-alignment is possible. This may significantly reduce assembly tolerances and the electrical/thermal manufacturing variations among the semiconductor device packets. In particular, a bond (e.g. solder) layer thickness control and a precise control of the location of the multi-clip connection element (height and lateral position) over the device carrier may be obtained. As a result, the total semiconductor package height H may be reduced compared to conventional packages having the same electrical/thermal specifications Prior to bonding, the multi-clip connection element may be placed as one piece over the device carrier and the semiconductor chips. Placement may also benefit from self-alignment caused by an interaction between the insulating connector and the device carrier.

Further, the first semiconductor chip, the second semiconductor chip, and the multi-clip connection element may at least partially be covered with an encapsulating material.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a device carrier;
a first semiconductor chip mounted on the device carrier;
a second semiconductor chip mounted on the device carrier;
a first contact clip bonded to a first electrode of the first semiconductor chip, wherein the first electrode of the first semiconductor chip is arranged on a main surface of the first semiconductor chip facing away from the device carrier;
a second contact clip bonded to a first electrode of the second semiconductor chip, wherein the first electrode of the second semiconductor chip is arranged on a main surface of the second semiconductor chip facing away from the device carrier;
an insulating connector holding the first contact clip and the second contact clip together; and
an encapsulant embedding the first semiconductor chip, the second semiconductor chip, the first contact clip, the second contact clip and the insulating connector, wherein the insulating connector is a pre-fabricated part distinct from the encapsulant and having a first side face, a second side face opposite the first side face and a top surface connecting the first side face and the second side face, wherein at least one of the first side face and the second side face of the insulating connector is connected to one of the first contact clip and the second contact clip by one of the group consisting of a groove and tongue connection, a clamp connection, and a snap fit connection, and wherein the top surface of the insulating connector is covered by the encapsulant.

2. The semiconductor device of claim 1, wherein the insulating connector comprises a first coupling portion connected to the first contact clip and a second coupling portion connected to the second contact clip.

3. The semiconductor device of claim 2, wherein at least one of the first coupling portion and the second coupling portion comprises an element selected from the group consisting of a tongue, a groove, a clamp element, and a snap fit element.

4. The semiconductor device of claim 2, wherein the first contact clip comprises a first bond portion and a second bond portion, wherein the first bond portion of the first contact clip is bonded to the first electrode of the first semiconductor chip and wherein the first coupling portion of the insulating connector is connected to the second bond portion of the first contact clip.

5. The semiconductor device of claim 4, wherein the first semiconductor chip is mounted on a first bond pad of the device carrier and the second bond portion of the first contact clip is bonded to a second bond pad of the device carrier.

6. The semiconductor device of claim 3, wherein the second contact clip comprises a first bond portion and a second bond portion, wherein the first bond portion of the second contact clip is bonded to the first electrode of the second semiconductor chip and wherein the second coupling portion of the insulating connector is connected to the first bond portion of the second contact clip.

7. The semiconductor device of claim 6, wherein the second bond portion of the second contact clip is bonded to a third bond pad of the device carrier.

8. The semiconductor device of claim 1, wherein the insulating connector is a pre-fabricated part.

9. The semiconductor device of claim 1, wherein the insulating connector comprises a support portion configured to support the insulating connector over the device carrier.

10. The semiconductor device of claim 9, wherein the support portion projects over the bottom of at least one of the first contact clip and the second contact clip.

11. The semiconductor device of claim 1, wherein at least one of the first contact clip and the second contact clip have a surface area which is exposed by the encapsulant.

12. The semiconductor device of claim 1, wherein the semiconductor device is a DC-DC converter or an AC-DC converter.

13. The semiconductor device of claim 1, wherein at least one of the first and second semiconductor chips is a power semiconductor chip.

14. The semiconductor device of claim 1, wherein the insulating connector consists of a material that is different from the material of the encapsulant.

15. A multi-clip connection element for use as an electrical connector in a semiconductor device package, comprising, when not being incorporated in the semiconductor device package:
a first contact clip which is an integrally formed part having a first bonding portion and a
second bonding portion, the first bonding portion extending in a lateral direction and having a surface configured to be bonded to an electrode of a first semiconductor chip, and the second bonding portion having a thickness in a height direction greater than a thickness of the first bonding portion in the height direction and comprising a side face;
a second contact clip which is an integrally formed part having a first bonding portion and a second bonding portion, the first bonding portion extending in a lateral direction and having a surface configured to be bonded to an electrode of a second semiconductor chip, and the second bonding portion having a thickness in the height direction greater than a thickness of the first bonding portion in the height direction and comprising a side face; and
an insulating connector holding the first contact clip and the second contact clip together, wherein the side faces of the second bonding portions of the first and second contact clips are facing each other, and wherein the insulating connector is coupled to the side faces of the second bonding portions of the first and second contact clips while leaving surfaces opposite the surfaces of the first bonding portions of the first and second contact clips exposed.

16. The multi-clip connection element of claim 15, wherein the insulating connector is connected to at least one of the first contact clip and the second contact clip by a groove and tongue connection, a clamp connection, a snap fit connection, and an adhesive bond.

17. The multi-clip connection element of claim 15, further comprising:
a third contact clip configured to be bonded to an electrode of a third semiconductor chip; and
a further insulating connector configured to hold one of the first and the second contact clip and the third contact clip together.

18. A method of manufacturing a semiconductor device, the method comprising:
mounting a first semiconductor chip on a device carrier;
mounting a second semiconductor chip on the device carrier; and thereafter
bonding a multi-clip connection element comprising a first contact clip, a second contact clip and an insulating connector holding the first contact clip and the second contact clip together to the first semiconductor chip, to the second semiconductor chip and to the device carrier,
wherein the insulating connector comprises a first side face having a first coupling portion coupled to a side face of the first contact clip and a second side face opposite the first side face and having a second coupling portion coupled to a side face of the second contact clip, wherein the insulating connector is coupled to the first and second contact clips before the multi-clip connection element is bonded to the first and second semiconductor chips and to the device carrier.

19. The method of claim 18, wherein during bonding the multi-clip connection element to the first semiconductor chip and to the second semiconductor chip, the multi-clip connection element moves into a predetermined rest position controlled by support of the multi-clip connection element on the device carrier.

20. The method of claim 18, further comprising:
covering the first semiconductor chip, the second semiconductor chip, and the multi-clip connection element at least partially with an encapsulating material.

* * * * *

UNITED STATES PATENT AND TRADEMARK OFFICE
CERTIFICATE OF CORRECTION

| | | |
|---|---|---|
| PATENT NO. | : 9,837,380 B2 | Page 1 of 1 |
| APPLICATION NO. | : 14/165720 | |
| DATED | : December 5, 2017 | |
| INVENTOR(S) | : T. Tan et al. | |

It is certified that error appears in the above-identified patent and that said Letters Patent is hereby corrected as shown below:

In the Claims

Claim 5 (Column 13, Line 57), please change "ismounted" to --is mounted--.

Signed and Sealed this
Twenty-second Day of May, 2018

Andrei Iancu
*Director of the United States Patent and Trademark Office*